Figure 1:
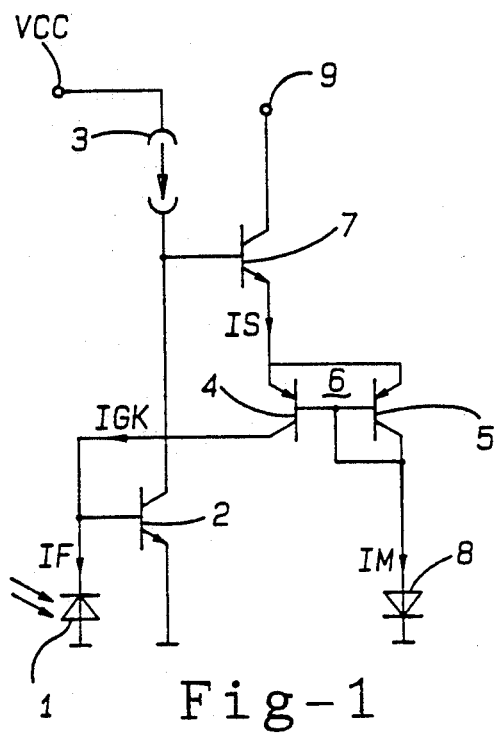

United States Patent [19]
Flocke et al.

[11] Patent Number: 5,256,986
[45] Date of Patent: Oct. 26, 1993

[54] CIRCUIT ARRANGEMENT FOR AMPLIFYING WEAK SENSOR CURRENTS

[76] Inventors: Heiner Flocke, Berlinerstrasse 8, D-6501 Bodenheim; Manfred Herz, Riedweg 45, D-6500 Mainz 43, both of Fed. Rep. of Germany

[21] Appl. No.: 734,519

[22] Filed: Jul. 23, 1991

[30] Foreign Application Priority Data

Jul. 24, 1990 [DE] Fed. Rep. of Germany ....... 4023435

[51] Int. Cl.[5] .............................................. H03F 1/34
[52] U.S. Cl. ............................... 330/293; 250/214 A; 330/307; 330/308
[58] Field of Search .................. 330/59, 307, 308, 293, 330/288; 250/214 A; 307/311; 359/189

[56] References Cited

U.S. PATENT DOCUMENTS

| | | | |
|---|---|---|---|
| 4,259,643 | 3/1981 | Monticelli et al. | 330/288 |
| 4,504,797 | 3/1985 | Eatock | 330/293 |
| 4,574,249 | 3/1986 | Williams | 330/59 |
| 4,904,860 | 2/1990 | Okagaki | 250/214 R |

Primary Examiner—James B. Mullins
Attorney, Agent, or Firm—Gifford, Groh, Sprinkle, Patmore and Anderson

[57] ABSTRACT

Described is a circuit arrangement for amplifying weak sensor currents, in particular the photoelectric current of a photoelectric diode (1), in which the photoelectric diode is connected to the base or gate electrode of a transistor (2). A constant current source (3) is connected into the collector circuit of the transistor (2). Connected between the collector and the base is a negative feedback which includes a current step-down circuit using at least one current mirror (6). The mother or sum current ($I_S$) is coupled out as the amplified signal current.

16 Claims, 3 Drawing Sheets

CIRCUIT ARRANGEMENT FOR AMPLIFYING WEAK SENSOR CURRENTS

The invention relates to a circuit arrangement as set forth in the classifying portion of claim 1.

The currents supplied by sensors are frequently extremely weak. This also applies in particular to the photoelectric currents which a photoelectric diode supplies when subjected to light. Therefore, evaluation of the photoelectric currents requires a current amplification effect which not only necessitates high amplification or gain factors but in addition must also be as constant as possible so that the amplified signal currents accurately and reliably reproduce the respective sensor currents.

For the purposes of amplifying such sensor currents, use is made in known manner of a transistor which is operated in an emitter circuit configuration and to the base of which is connected the respective sensor, for example a photoelectric diode. A constant current source is disposed in the collector circuit of the transistor and the base is supplied from the collector by way of a very high resistance with a negative feedback current which compensates for the respective photoelectric current. The amplified negative feedback current then accurately reproduces the photoelectric current. A disadvantage with that arrangement however is that the required high resistance values which in the case of photoelectric currents are in the nano and micro ampere range, for example in the range of 10MΩ and more, are to be embodied in a manner which can only be reproduced with difficulty, in particular when the amplification circuit is part of an integrated circuit. In addition the amplification or gain factors which can be achieved are frequently not sufficient.

Accordingly the object of the present invention is to provide an amplification circuit for weak sensor currents, which at a low level of expenditure permits high amplification or gain factors and which can be satisfactorily embodied in integrated form.

The means for attaining that object are set forth in claim 1.

The current step-down or reduction factor can be set and maintained in a highly accurate and reproducible fashion, in a current mirror. Particularly when, in accordance with a further development of the invention, the sum current of the first current mirror is fed to a further current step-down circuit with a further current mirror whose mother or sum current is coupled out as a signal current, it is possible overall to achieve very high gain factors. In that respect, it is then optionally also possible in the same manner for a third or additional current mirror to have a respective further current step-down means disposed downstream thereof, in order further to increase the gain factor.

The transistors used may be bipolar transistors or also field effect transistors, in particular MOS-transistors, or combinations. Desirably the transistor to whose base electrode the sensor is connected is a Darlington transistor, in particular a triple Darlington transistor, in order to achieve high gain factors.

In order to produce the signal current, the mother or sum current of the current mirror or the respective last current mirror can be directly coupled out. It is also advantageous however for the sum current to be coupled out by way of a follower transistor.

The circuit arrangements according to the invention are suitable both for the amplification of weak sensor direct currents and also weak sensor alternating currents. Frequently however superimposed on a sensor direct current is a weaker alternating current which represents the actual useful signal. That applies for example when a photoelectric diode is irradiated with steady light on which variable-intensity light is superimposed, as the useful signal. If the alternating current useful signal is then to be obtained separately, it is possible in the usual manner to provide a capacitor for the purposes of separating off the direct current signal. However such a capacitor must be comparatively large and therefore cannot be embodied with the other components of the circuit arrangement in the form of an integrated circuit. Therefore, for the purposes of separately obtaining an amplified signal alternating current, a further development of the invention provides that a negative feedback alternating current is supplied to the base or gate electrode of the transistor by way of a capacitor, wherein the negative feedback alternating current is obtained by means of a current step-down circuit, using a current mirror which is controlled by a voltage proportional to the signal current, the mother or sum current of the current mirror being coupled out as the signal alternating current. The feedback alternating current is small in comparison with the signal alternating current because of the use of the current step-down circuit in the form of a current mirror so that the coupling capacitor can also be very small. It may be embodied for example in the form of a barrier-layer capacitor in integrated form. The voltage which is proportional to the signal current can desirably be taken off at a resistor which is disposed in the mother current circuit of the current mirror or the further current mirror. The voltage which is proportional to the signal current is advantageously passed to the positive input of a differential amplifier, the negative input of which is connected to the capacitor and is adjusted by way of a regulating circuit to the voltage at the positive input. The sum current of the alternating current mirror can be coupled out by way of a follower transistor whose base or gate electrode is connected to the output of the differential amplifier. The differential amplifier may be an operational amplifier, but it may also be embodied in the form of an individual transistor. When the circuit arrangement is embodied in integrated form, the transistors of the current mirror or mirrors and also of the alternating current mirror or mirrors may desirably be embodied in the form of lateral transistors in a trough or well in the integrated circuit. In that connection, in order to achieve a high current stepdown effect, the edge length relationship of the two transistors of each current mirror should be of a high value in the range of between 3 and 30, preferably about 10. When using two cascade-connected mirrors, the common emitter of the first current mirror may be disposed in the form of a rectangle in the U-shaped collector of the transistor carrying the mother current. Then, disposed at the open narrow side of the U-shaped collector is the common emitter of the subsequent current mirror which as the sum current receives the mirrored collector current of the first current mirror, that collector current being smaller by the edge length relationship K. The mother current of the second current mirror is taken off, for example to the substrate or to the U-shaped collector, and its mirrored, weaker current is the current which is involved in negative feedback to the base of the transistor.

The common emitter of the subsequent current mirror can in turn be arranged as a rectangle between the limbs of the U-shaped collector of the transistor of the first current mirror, which carries the mother current, in which case the collector of the second current mirror, which carries the mirrored current, is disposed at the narrow side of the common emitter.

Figure 2:
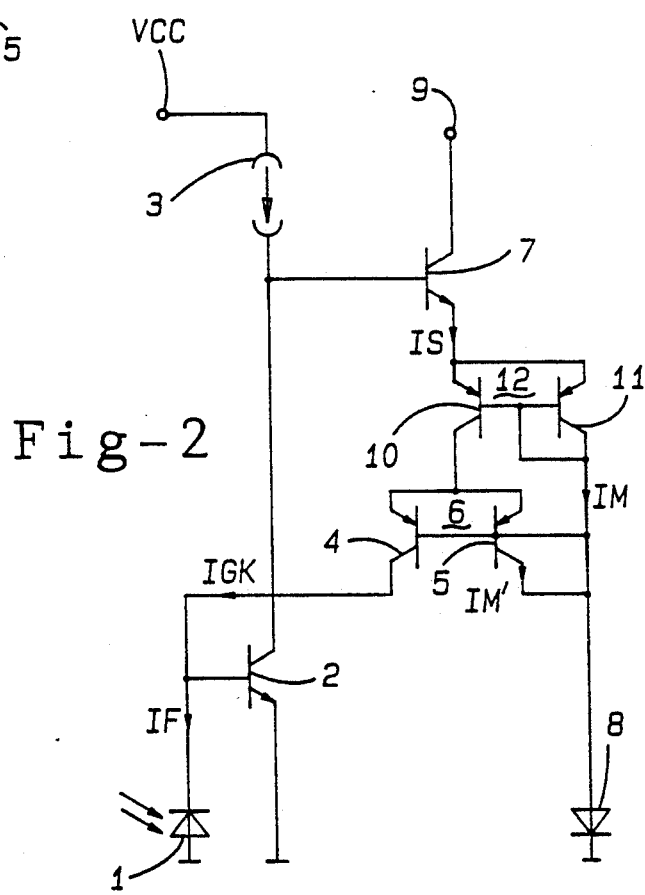
Figure 3:
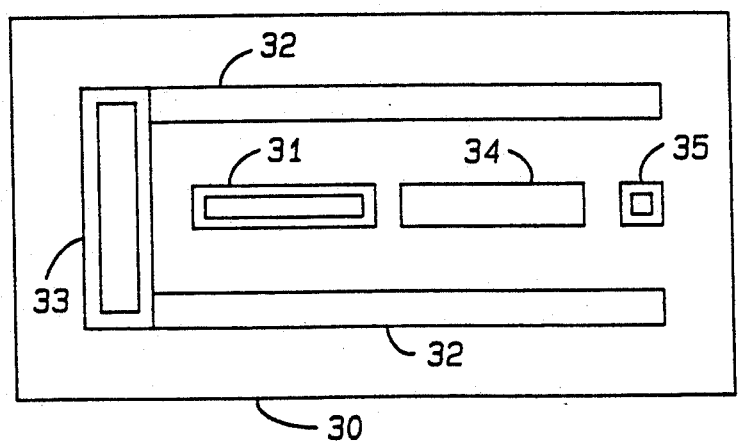
Figure 4:
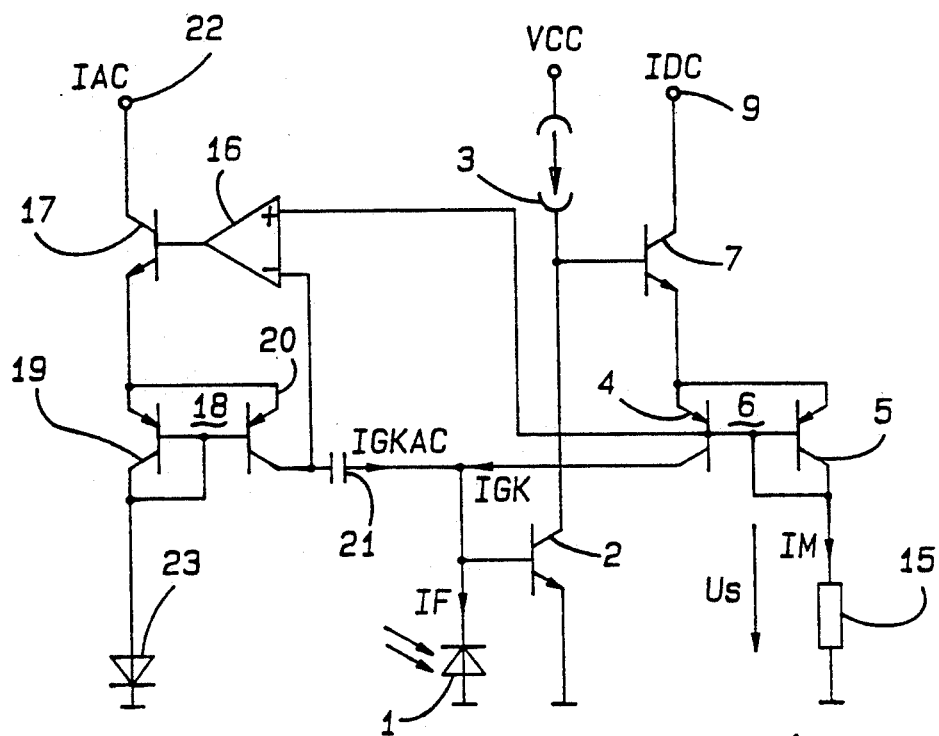
Figure 5:
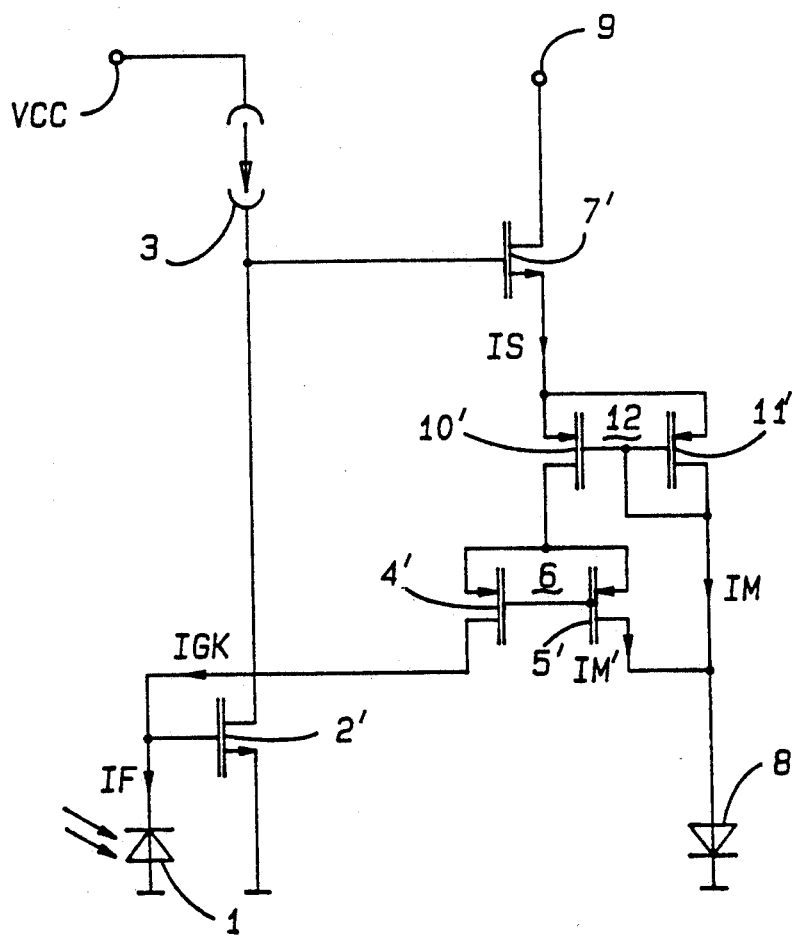
Figure 6:
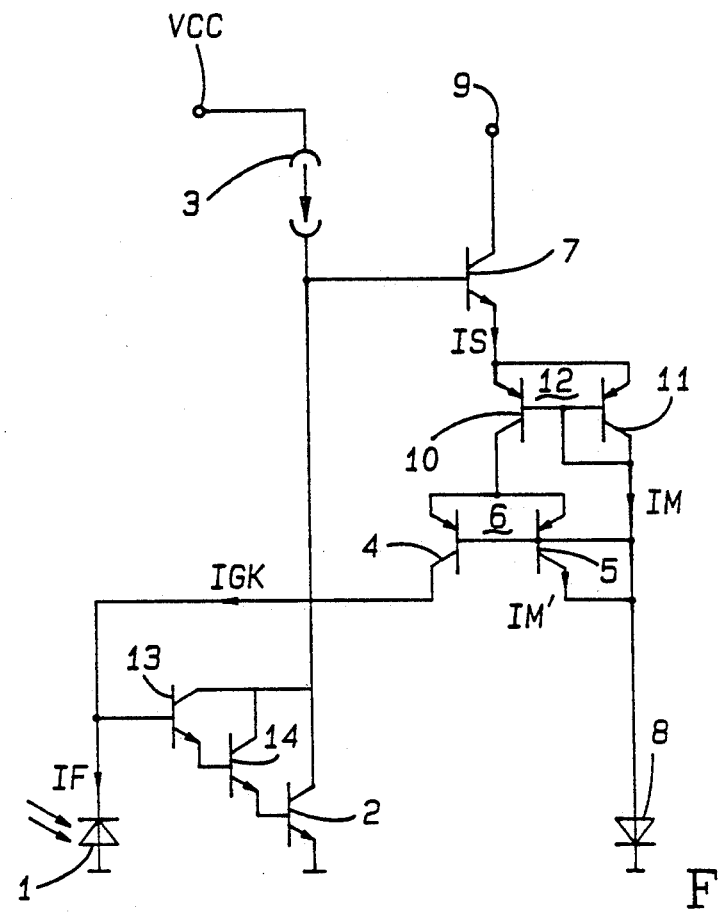
Figure 7:
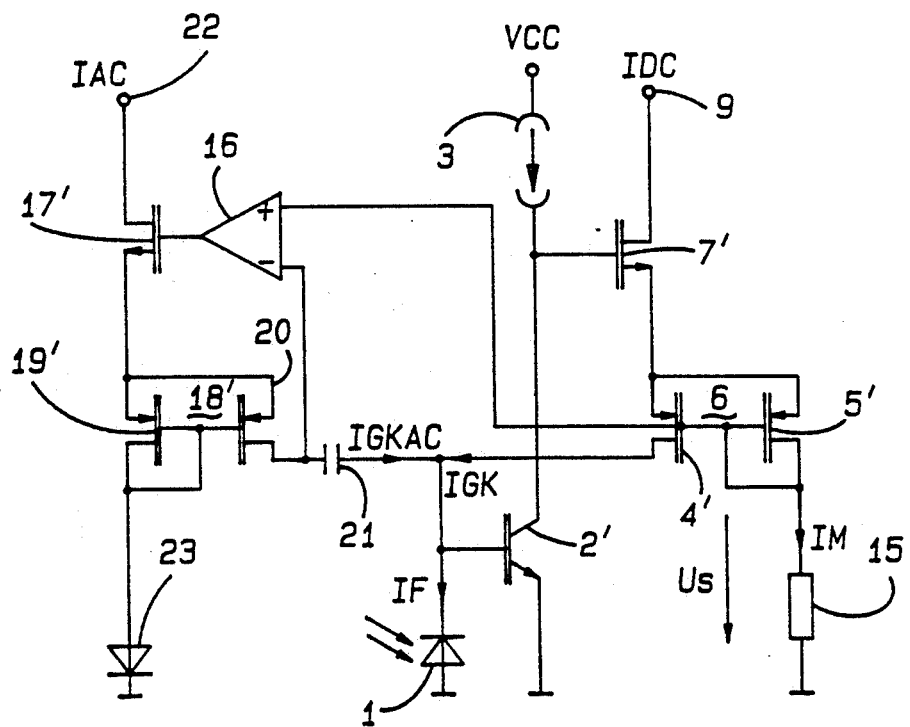

Embodiments of the invention are described hereinafter with reference to the drawings in which:

FIG. 1 shows an embodiment of a circuit arrangement for amplifying the photoelectric current of a photoelectric diode with a single current mirror, FIG. 2 shows the circuit arrangement of FIG. 1 with a cascade-connected further current mirror, FIG. 3 is a diagrammatic view of the arrangement of the current mirrors for the circuit shown in FIG. 2, that arrangement being embodied in the form of an integrated circuit with lateral transistors, FIG. 4 shows an embodiment of a circuit arrangement for separately producing an amplified alternating signal current;

FIG. 5 is an embodiment similar to that shown in FIG. 2, with field effect transistors being substituted for the bipolar transistors; and FIG. 6 is an embodiment similar to that shown in FIG. 2, with two further bipolar transistors added to transistor 2 in order to form a triple Darlington Transistor, and FIG. 7 is an embodiment similar to that shown in FIG. 4, with field effect transistors being substituted for bipolar transistors.

In the circuit arrangement shown in FIG. 1, a photoelectric diode 1 is connected to the base of an npn-transistor 2 which is operated in an emitter circuit configuration, supplies a photoelectric current $I_F$. Disposed in the collector circuit of the transistor 2 is a constant current source 3 which is supplied by the operating voltage $V_{CC}$. The constant current source may possibly also be embodied in the form of a high-value resistance. A negative feedback current $I_{GK}$ is fed to the base of the transistor 2 by way of a pnp-transistor 4 which is connected to a further pnp-transistor 5, as a current mirror 6. The sum current $I_S$ of the current mirror flows by way of an npn-follower transistor 7 to the two emitters of the current mirror transistors 4, 5. The base of the follower transistor 7 is connected to the collector of the transistor 2. A diode 8 provides for a reference voltage at the base of the current mirror transistors 4, 5.

If it is provided that the transistor 5 is of substantially larger area than the transistor 4, then the mother current $I_M$ which flows by way of the transistor 5, is greater by the area or edge length relationship K than the mirrored negative feedback current $I_{GK}$ which flows by way of the transistor 4. That provides that the sum current $I_S$ is greater by the factor $(K+1)$ than the current which flows through the photoelectric diode 1. The sum current $I_S$ therefore represents the amplified signal current which can be taken off or delivered at the terminal 9.

The circuit shown in FIG. 2 is identical in its essential parts to the circuit shown in FIG. 1 and therefore corresponding components are identified in the same manner. The difference is that the sum current of the current mirror 6 with the transistors 4, 5 is now no longer directly delivered by the follower transistor 7 but has been divided down by means of a further current mirror 12 with two pnp-transistors 10, 11, also by a factor K. The sum current $I'_S$ of the current mirror 6 which comes from the collector of the transistor 10 as the mirrored current is then again smaller by the factor K than the mother current $I_M$ of the current mirror 12, which flows by way of the transistor 11. The total sum current $I_S$ which once again is the signal current is then of the following value:

$$I_S = I_F(K+1)^2.$$

With an assumed value of $K=9$, that then gives the gain factor of 100. If a further current mirror were to be cascade-connected in the same manner, that would give a gain factor of 1000, etc.

The amplified signal current could also be taken off as a mother current $I_M$, instead of the sum current $I_S$. Then, for example a further current mirror can serve instead of the diode 8 as the reference voltage source.

FIG. 3 shows the practical embodiment of the two current mirrors 6, 12 of the circuit shown in FIG. 2 in the form of an integrated circuit, the drawing showing a single well or trough 30 of the entire integrated circuit. The current mirror 12 has a common rectangular emitter area 31 for the transistors 10, 11. The collector of the transistor 11 is formed by a U-shaped strip 32 which surrounds the emitter 31. The base is formed by an area 33 which, as FIG. 2 also shows, is directly connected to the U-shaped collector 32. The collector of the transistor 10 which is at the same time the common emitter of the transistors 4, 5 of the current mirror 6 is the narrow side, which is disposed in opposite relationship to the narrow side of the emitter area 31, of a further emitter area 34 for the transistors 4, 5 of the current mirror 6. The collector of the transistor 5, which carries the mother current, is formed by the parts of the U-shaped strip 32 which extend parallel and which are in opposite relationship to the long sides of the emitter area 34. The collector of the transistor 4 is the square 35 which is in opposite relationship to the other narrow side of the emitter area 34. The areas 31, 32, 33 and 35 each have respective contact surfaces, while an external connection is not required for the common emitter area 34.

It will be seen that, for both current mirrors 6, 12, the respective effective edge area of the one collector is substantially greater than that of the other collector. Thus the effective edge length of the collector for the transistor 11 is formed by those parts of the strip 32 which are in opposite relationship to the two long sides and a narrow side of the common emitter area 31. The remaining edge length for the collector of the transistor 10 is determined by the length of the narrow side of the further emitter area 34 and is thus substantially smaller. A similar point applies in regard to the edge length relationship of the current mirror 6 with the transistors 4, 5. Here too the effective edge length of the collector for the transistor 5, which is defined by the two long sides of the emitter area 34, is substantially greater than the edge length for the collector of the transistor 4, which edge length corresponds to the length of the side of the square 35.

The circuit arrangement shown in FIG. 4 substantially corresponds in the right-hand part with the photoelectric diode 1, the transistor 2, the current mirror 6 and the follower transistor 7, to the circuit arrangement shown in FIG. 1. Therefore the same reference numerals have been used. Departing from the circuit arrangement shown in FIG. 1 however, the mother current $I_M$ of the current mirror 6 flows by way of a resistor 15 at which a signal voltage $U_S$ which is proportional to the photoelectric current is dropped off. That voltage $U_S$ is passed to the non-inverting input of an operational amplifier 16. The output of the operational amplifier 16 controls a follower transistor 17 whose emitter current feeds a current mirror 18 having two transistors 19, 20. The operational amplifier 16, together with the follower transistor 17 and the transistor 20, forms a regulating circuit which provides that the same voltage $U_S$ is applied to the inverting input of the operational amplifier 16, as the non-inverting input. Accordingly, by way of the capacitor 21, the base of the transistor 2 is supplied with a negative feedback alternating current $I_{GKAC}$ which is proportional to signal voltage $U_S$, the frequency and the capacitance of capacitor 21. As in the case of the current mirror 6 the arrangement provides that the transistor 19 has substantially larger areas than the transistor 20 so that the mother current $I_M$ which flows by way of the transistor 19 is greater by the area or edge length relationship than the mirrored current which flows by way of the transistor 20. The sum current $I_{AC}$ at the terminal 22 accordingly represents an amplified signal alternating current which can be taken off or delivered at the terminal 22. A diode 23 again provides for a reference voltage at the base of the current mirror transistors 19, 20.

The capacitor 21 can be very small by virtue of the current step-down circuit by means of the current mirror 6, and may be for example of a value in the region of 20 pf and can therefore be embodied by a barrier-layer capacitor in integrated form. Similarly to the case of the circuit arrangement shown in FIG. 2, the current mirror 18 which is also referred to herein as an alternating current mirror in order better to distinguish the circumstances can be replaced by a cascade circuit of two or more current mirrors in order to produce a signal alternating current of greater gain.

The practical embodiment of the current mirror 18 and possibly further current mirrors disposed downstream thereof can again be of the configuration described with reference to FIG. 3.

The lower frequency limit of the circuit arrangement shown in FIG. 4 is determined by the value of the resistor 15 and the capacitor 21 and the current transformation ratio of the current mirror 6. It is for example 20 KHz so that low-frequency disturbances which originate for example from fluorescent tubes are blanked out. The upper frequency limit is determined in the usual manner by parasitic capacitances and the properties of the components. It is for example 1 MHz.

Accordingly, by means of the circuit arrangement shown in FIG. 4, it is possible to obtain at the terminal 9 a signal direct current $I_{DC}$ which corresponds to the irradiating steady light and includes an ac component which is attenuated above an upper frequency limit as determined by capacitor 21. Independently thereof, at the terminal 22, a signal alternating current $I_{AC}$ can be obtained which corresponds to the irradiating variable-intensity light. The entire circuit arrangement can be in the form of a monolithic integrating circuit.

FIG. 5 is similar to the embodiment shown in FIG. 2, except that the transistors 2, 4, 5, 7, 10, and 11 have been replaced with field effect transistors (FET's) 2', 4', 5', 7', 10', and 11', respectively.

FIG. 6 is similar to the embodiment shown in FIG. 2, except that two additional bipolar transistors, 13 and 14, have been added to the transistor 2 in order to provide a triple Darlington transistor.

FIG. 7 is similar to the embodiment shown in FIG. 2, except that the transistors 2, 4, 5, 7, 17, 18 and 19 have been replaced by field-effect transistors 2', 4', 5', 7', 17', 18' and 19', respectively.

We claim:

1. A circuit arrangement for amplifying weak sensor currents in which the current is passed to the base electrode of a transistor (2) which is operated in an emitter circuit configuration and in whose collector circuit is disposed a constant current source (3), and with a negative feedback between the collector and base electrode of the transistor (2), characterised in that the negative feedback includes a current step-down circuit using a current mirror (6) and further comprising in that a sum current of the current mirror is passed to the current step-down circuit using a further current mirror (12) whose sum current is coupled out as the signal current $(I_S)$.

2. The circuit arrangement as set forth in claim 1 characterised in that the transistor is a Darlington transistor (2).

3. The circuit arrangement as set forth in claim 1 characterised in that the sum current $(I_S)$ of the further current mirror (12) is coupled out by way of a follower transistor (7).

4. The circuit arrangement as set forth in claim 1 characterized in that the current mirrors (6, 12) comprise transistors embodied as lateral transistors in a well (30) of an integrated circuit, each lateral transistor having an edge length and that the edge length relationship (K) of the transistors (4, 5; 10, 11; 19, 20) of each current mirror (6, 12) is of a value in the range of between 3 and 30.

5. The circuit arrangement as set forth in claim 4 characterized in that a common emitter of the further current mirror (12) is arranged as a rectangle (31) in a U-shaped collector (32) of the transistor (11) which carries the mother current, that a common emitter (34) of the current mirror (6) is arranged at an open narrow side of the U-shaped collector (32) and receives as the sum current $(I'_S)$ the mirrored collector current of the further current mirror (12), which collector current is smaller by the value K, and that the mother current $(I'_M)$ of the current mirror (6) is taken off and its mirrored smaller current is the current $(I_{GK})$ which is negatively fed back to the base of the transistor (2).

6. The circuit arrangement as set forth in claim 5 characterized in that the common emitter of the current mirror (6) is also arranged as a rectangle (34) between limbs of the U-shaped collector (32) of the transistor (11) of the further current mirror (12), which transistor carries the mother current, and that the collector (35) of the current mirror (6), which collector carries the mirrored current $(I_{GK})$, is arranged at a narrow side of the common emitter (34).

7. A circuit arrangement for amplifying weak sensor currents in which the current is passed to the base electrode of a transistor (2) which is operated in an emitter circuit configuration and in whose collector circuit is disposed a constant current source (3), and with a negative feedback between the collector and base electrode of the transistor (2), characterized in that the negative feedback includes a current step-down circuit using a current mirror (6) whose sum current is coupled out as a signal current $(I_S)$ and further characterized in that a negative feedback alternating current $(I_{GKAC}$ is fed to the base electrode of the transistor (2) by way of a capacitor (21) and that the negative feedback alternating current is obtained by means of a current step-down circuit comprising at least one alternating current mirror (18), means for controlling said current mirror by a voltage ($U_S$) which is proportional to the signal current ($I_S$), the sum current of the alternating current mirror (18) being coupled out as a signal alternating current ($I_{AC}$).

8. The circuit arrangement as set forth in claim 7 characterized in that the voltage ($U_S$) is proportional to the signal current ($I_S$) and is taken off at a resistor (15) which is disposed in the mother circuit of the current mirror (6).

9. The circuit arrangement as set forth in claim 7 characterized in that the voltage ($U_S$) is proportional to the signal current ($I_S$) and is passed to a positive input of a differential amplifier (16) having a negative input connected to the capacitor (21), which negative input is adjusted by way of a regulating circuit (17) to the voltage at the positive input of the differential amplifier 16.

10. The circuit arrangement as set forth in claim 9 characterized in that the sum current of the at least one alternating current mirror (18) is coupled out by way of the regulating circuit which comprises a follower transistor (17) whose base electrode is connected to an output of the differential amplifier (16).

11. The circuit arrangement as set forth in claim 7 characterized in that the voltage ($U_S$) is proportional to the signal current ($I_S$) and is passed to a positive input of a differential amplifier (16) having a negative input connected to the capacitor (21), which negative input is adjusted by way of a regulating circuit (17) to the voltage at the positive input of the differential amplifier 16.

12. The circuit arrangement as set forth in claim 11 characterized in that the sum current of the at least one alternating current mirror (18) is coupled out by way of the regulating circuit which comprises a follower transistor (17) whose gate electrode is connected to an output of the differential amplifier 16.

13. A circuit arrangement for amplifying weak sensor currents in which the current is passed to the gate electrode of a transistor (2') which is operated in a source circuit configuration and in whose drain circuit is disposed a constant current source (3), and with a negative feedback between the drain and gate electrode of the transistor (2'), characterized in that the negative feedback includes a current step-down circuit using a current mirror (6) whose sum current is coupled as a signal ($I_S$) and further comprising in that a sum current of the current mirror is passed to the current step-down circuit using a further current mirror (12) whose sum current is coupled out as the signal current ($I_S$).

14. The circuit arrangement as set forth in claim 13 characterized in that the sum current ($I_S$) of the further current mirror (12) is coupled out by way of a follower transistor (7).

15. A circuit arrangement for amplifying weak sensor currents in which the current is passed to the gate electrode of a transistor (2) which is operated in a source circuit configuration and in whose drain circuit is disposed a constant current source (3), and with a negative feedback the drain and gate electrode of the transistor (2), characterized in that the negative feedback includes a current step-down circuit using a current mirror (6) whose sum current is coupled out as a signal current ($I_S$) and further characterized in that a negative feedback alternating current ($I_{GKAC}$) is fed to the gate electrode of the transistor (2) by way of a capacitor (21) and that the negative feedback alternating current is obtained by means of a current step-down circuit, said step-down circuit comprising at least one alternating current mirror (18), means for controlling said current mirror by a voltage ($U_S$) which is proportional to the signal current ($I_S$) the sum current of said alternating current mirror (18) being coupled out as a signal alternating current ($I_{AC}$).

16. The circuit arrangement as set forth in claim 15 characterized in that the voltage ($U_S$) is proportional to the signal current ($I_S$) and is taken off at a resistor (15) which is disposed in the mother circuit of the current mirror (6).

* * * * *

UNITED STATES PATENT AND TRADEMARK OFFICE
CERTIFICATE OF CORRECTION

PATENT NO. : 5,256,986
DATED : October 26, 1993
INVENTOR(S) : Heiner Flocke, et al It is certified that error appears in the above-indentified patent and that said Letters Patent is hereby corrected as shown below:

Column 1, line 1 and 2, delete "as set forth in the classifying portion of claim 1".

Column 1, line 43 and 44, delete "The means for attaining that object are set forth in claim 1."

Signed and Sealed this

Twelfth Day of July, 1994

Attest:

BRUCE LEHMAN

*Attesting Officer*  *Commissioner of Patents and Trademarks*